United States Patent
Lee et al.

(10) Patent No.: US 12,135,356 B2
(45) Date of Patent: Nov. 5, 2024

(54) APPARATUS AND METHOD FOR DIAGNOSING STATE OF BATTERY PACK

(71) Applicant: LG ENERGY SOLUTION, LTD., Seoul (KR)

(72) Inventors: Dong-Chun Lee, Daejeon (KR); Won-Hoe Lee, Daejeon (KR); Seog-Jin Yoon, Daejeon (KR); Suk-Hoon Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 718 days.

(21) Appl. No.: 17/424,280

(22) PCT Filed: Jul. 10, 2020

(86) PCT No.: PCT/KR2020/009144
§ 371 (c)(1),
(2) Date: Jul. 20, 2021

(87) PCT Pub. No.: WO2021/006708
PCT Pub. Date: Jan. 14, 2021

(65) Prior Publication Data
US 2022/0069371 A1     Mar. 3, 2022

(30) Foreign Application Priority Data
Jul. 10, 2019 (KR) .................. 10-2019-0083361

(51) Int. Cl.
*G01R 31/382* (2019.01)
*G01R 31/36* (2020.01)
(Continued)

(52) U.S. Cl.
CPC ....... *G01R 31/382* (2019.01); *G01R 31/3648* (2013.01); *G01R 31/3842* (2019.01);
(Continued)

(58) Field of Classification Search
CPC .......... H01M 10/482; H01M 10/4207; H01M 10/425; H01M 50/204; H01M 2010/4271;
(Continued)

(56) References Cited

U.S. PATENT DOCUMENTS 5,886,503 A     3/1999   McAndrews et al.
6,621,250 B1 *  9/2003   Ohkubo ............... H02J 7/0049
                                               324/426
(Continued)

FOREIGN PATENT DOCUMENTS

CN     1668933 A     9/2005
CN   102483441 A     5/2012
(Continued)

OTHER PUBLICATIONS

International Search Report (PCT/ISA/210) issued in PCT/KR2020/009144 mailed on Oct. 29, 2020.
(Continued)

*Primary Examiner* — Richard Isla
*Assistant Examiner* — Johali A Torres Ruiz
(74) *Attorney, Agent, or Firm* — Birch, Stewart, Kolasch & Birch, LLP

(57) ABSTRACT

The present disclosure relates to an apparatus and method for diagnosing a state of a battery pack, and more particularly, to an apparatus and method for diagnosing a state of a battery pack based on a SOC of a battery module included in the battery pack. According to the present disclosure, since the SOC of the battery module corresponding to an induced abnormal situation is estimated and the state of each battery module is diagnosed based on the estimated SOC, a risk factor that may occur in the battery module may be diagnosed in advance.

13 Claims, 8 Drawing Sheets

(51) Int. Cl.
 *G01R 31/3842* (2019.01)
 *G01R 31/388* (2019.01)
 *G01R 31/396* (2019.01)
 *H01M 10/48* (2006.01)

(52) U.S. Cl.
 CPC ......... *G01R 31/388* (2019.01); *G01R 31/396* (2019.01); *H01M 10/482* (2013.01)

(58) Field of Classification Search
 CPC ............ G01R 31/3648; G01R 31/3842; G01R 31/396; G01R 31/388; G01R 31/389; G01R 31/392; Y02E 60/10; H02J 7/0031
 See application file for complete search history.

(56) References Cited

U.S. PATENT DOCUMENTS

| | | | |
|---|---|---|---|
| 2004/0001996 A1 | 1/2004 | Sugimoto | |
| 2005/0269991 A1 | 12/2005 | Mitsui et al. | |
| 2010/0261048 A1* | 10/2010 | Kim .................... | H02J 7/0063 429/150 |
| 2011/0050236 A1 | 3/2011 | Sekizaki et al. | |
| 2011/0199115 A1 | 8/2011 | Iida | |
| 2012/0158330 A1 | 6/2012 | Araki | |
| 2012/0173179 A1 | 7/2012 | Matsumoto | |
| 2014/0176147 A1* | 6/2014 | Wiegman ............. | G01R 31/382 324/434 |
| 2015/0032394 A1 | 1/2015 | Kimura et al. | |
| 2015/0285867 A1 | 10/2015 | Wang et al. | |
| 2015/0355286 A1 | 12/2015 | Kobayashi et al. | |
| 2016/0187431 A1 | 6/2016 | Yamamoto et al. | |
| 2016/0291683 A1 | 10/2016 | Kacker et al. | |
| 2016/0363632 A1 | 12/2016 | Park et al. | |
| 2017/0045587 A1 | 2/2017 | Kim et al. | |
| 2017/0201103 A1 | 7/2017 | Jeon et al. | |
| 2018/0143258 A1 | 5/2018 | Kim et al. | |
| 2019/0041466 A1 | 2/2019 | Goto et al. | |
| 2019/0148952 A1* | 5/2019 | Remboski ........... | H02J 7/00302 320/128 |

FOREIGN PATENT DOCUMENTS

| | | |
|---|---|---|
| CN | 104977543 A | 10/2015 |
| CN | 108196190 A | 6/2018 |
| FR | 2 976 743 A1 | 12/2012 |
| JP | 2004-031120 A | 1/2004 |
| JP | 2010-104175 A | 5/2010 |
| JP | 2012-34535 A | 2/2012 |
| JP | 2013-160539 A | 8/2013 |
| JP | 2016-102874 A | 6/2016 |
| JP | 2018-166388 A | 10/2018 |
| JP | 6405942 B2 | 10/2018 |
| JP | 2019-32198 A | 2/2019 |
| KR | 10-1572494 B1 | 11/2015 |
| KR | 10-1642329 B1 | 7/2016 |
| KR | 10-2017-0020072 A | 2/2017 |
| KR | 10-2017-0074132 A | 6/2017 |
| KR | 10-2017-0084608 A | 7/2017 |
| WO | WO 2011/007805 A1 | 1/2011 |

OTHER PUBLICATIONS

European Search Report ('EESR') for Application No. 20837403.3 issued on Apr. 5, 2022.

* cited by examiner

APPARATUS AND METHOD FOR DIAGNOSING STATE OF BATTERY PACK

TECHNICAL FIELD

The present application claims priority to Korean Patent Application No. 10-2019-0083361 filed on Jul. 10, 2019 in the Republic of Korea, the disclosures of which are incorporated herein by reference.

The present disclosure relates to an apparatus and method for diagnosing a state of a battery pack, and more particularly, to an apparatus and method for diagnosing a state of a battery pack based on a SOC of a battery module included in the battery pack.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at the present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-discharging rate and high energy density.

Meanwhile, a large-capacity battery used in an electric vehicle, a hybrid electric vehicle or an energy storage system includes an aggregate of a plurality of unit cells connected in series and/or in parallel. The battery in which a plurality of unit cells are connected has a variation in charging capacity between the unit cells, as charging and discharging are repeated. If charging or discharging is continued in a state of leaving the variation in charging capacity, performance is degraded, and some unit cells may come into an overcharge or overdischarge state. The overcharge or overdischarge state acts as a factor that impairs the safety of the unit cell, and in some cases, may cause an unexpected accident such as an explosion.

In order to solve the above problem, techniques for diagnosing a state of a battery pack have been developed in the prior art. For example, Patent Literature 1 discloses a battery management device that estimates a state of charge (SOC) of each battery module and determines that the battery module is abnormal if the deviation of the SOC estimated for each battery module is equal to or greater than a limit deviation, and a battery management method using the same.

Specifically, in Patent Literature 1, the SOC of each battery module is estimated, and abnormality of the battery module or the battery management device itself is recognized based on the deviation of the estimated SOC.

However, in Patent Literature 1, the SOC of the battery module is just estimated, and abnormality of the battery module or the battery management device itself is just recognized based on the deviation of the estimated SOC. Namely, Patent Literature 1 does not disclose a configuration for inducing an abnormal situation such as cutoff of a battery cell included in the battery module and diagnosing a state of the battery module in the induced abnormal situation.

(Patent Literature 1) KR 10-1642329 B1

DISCLOSURE

Technical Problem

The present disclosure is designed to solve the problems of the related art, and therefore the present disclosure is directed to providing an apparatus and method for diagnosing a state of a battery pack, which blocks the connection of some of battery cells included in a battery module provided in the battery pack and diagnoses a state of the battery module and the battery pack based on a SOC of the battery module.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided an apparatus for diagnosing a state of a battery pack, comprising: a charging and discharging assembly configured to discharge and charge a plurality of battery modules having a plurality of battery cells connected to each other, in a plurality of cycles; a monitoring assembly configured to measure a voltage or current of the plurality of battery modules in a fully charged state, in every cycle; and a controller configured to, in every cycle, change the number of battery cells included in the plurality of battery modules and connected to each other, receive a measurement value for the voltage or current of the plurality of battery modules measured by the monitoring assembly, estimate a state of charge (SOC) of each of the plurality of battery modules based on the received measurement value, calculate a SOC change amount by comparing the estimated SOC of each of the plurality of battery modules with a preset reference value, and diagnose a state of the plurality of battery modules based on the calculated SOC change amount and the changed number of battery cells included in the plurality of battery modules.

The controller is configured to change the number of battery cells included in the plurality of battery modules and connected to each other by: selecting a target battery module among the plurality of battery modules, select a target battery cell among the plurality of battery cells included in the selected target battery module, and block a connection between the target battery cell and the remaining cells in the selected target battery module.

The controller may be configured to select the target battery module in every cycle such that the selected target battery module does not overlap with a target battery module selected in a former cycle.

The controller may be configured to, in every cycle, change the number of target battery cells selected in the target battery module.

The charging and discharging assembly may be configured to discharge and charge battery cells connected to each other among the plurality of battery cells included in the plurality of battery modules.

The controller may be configured to diagnose the state of each battery module as a normal state or a warning state according to a range of the calculated SOC change amount for each battery module, among a plurality of reference ranges set based on the number of total battery cells included in each battery module, and output the diagnosis result.

The controller may be configured to block the connection between the battery pack and the battery module among the plurality of battery modules whose state is diagnosed as the warning state, re-estimate the SOC of the battery module disconnected from the battery pack after a predetermined time passes, compare the re-estimated SOC with the preset reference value, and output a diagnosis code based on the comparison result.

A battery pack according to another aspect of the present disclosure may comprise the apparatus for diagnosing a state of a battery pack according to according to an aspect of the present disclosure.

A method for diagnosing a state of a battery pack according to still another aspect of the present disclosure may comprise: a charging and discharging step of discharging and charging a plurality of battery modules having a plurality of battery cells connected to each other, in every cycle; a monitoring step of measuring a voltage or current of the plurality of battery modules in a fully charged state; a SOC estimating step of estimating a SOC of each battery module based on the voltage or current measured in the monitoring step; a SOC change amount calculating step of calculating a SOC change amount by comparing the estimated SOC of each battery module with a preset reference value; and a diagnosing step of diagnosing a state of the plurality of battery modules based on the calculated SOC change amount.

The method for diagnosing a state of a battery pack according to still another aspect of the present disclosure may further comprise, before the charging and discharging step: a target battery module selecting step of selecting a target battery module among the plurality of battery modules; a target battery cell selecting step of selecting a target battery cell among the plurality of battery cells included in the selected target battery module; and a connection blocking step of blocking the connection between the target battery cell and the remaining cells in the selected target battery module.

The diagnosing step may include: a battery module state determining step of determining the state of each battery module as any one of a normal state and a warning state, based on a range to which the calculated SOC change amount belongs, among a plurality of reference ranges set based on the number of total battery cells included in each battery module; a battery module connection blocking step of blocking the connection between the battery module determined as the warning state and the battery pack, as a result of the determination in the battery module state determining step; a SOC re-estimating step of re-estimating the SOC of the battery module disconnected from the battery pack, after a predetermined time passes from the battery module connection blocking step; and a diagnosis code outputting step of comparing the re-estimated SOC with a predetermined reference value and outputting a diagnosis code based on the comparison result.

Advantageous Effects

According to the present disclosure, since the SOC of the battery module corresponding to an induced abnormal situation is estimated and the state of each battery module is diagnosed based on the estimated SOC, a risk factor that may occur in the battery module may be diagnosed in advance.

In addition, according to the present disclosure, since the state of each battery module is diagnosed, there is an advantage in that time and cost may be saved compared to the case of monitoring each battery cell.

In addition, according to the present disclosure, since various abnormal situations are induced for each battery module and the state of each battery module according to the induced abnormal situations may be diagnosed, it is possible to diagnose the state of the battery module from various aspects.

The effects of the present disclosure are not limited to the above, and other effects not mentioned herein will be clearly understood by those skilled in the art from the appended claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, a preferred embodiment of the present disclosure will be described in detail with reference to the accompanying drawings.

Figure 1:
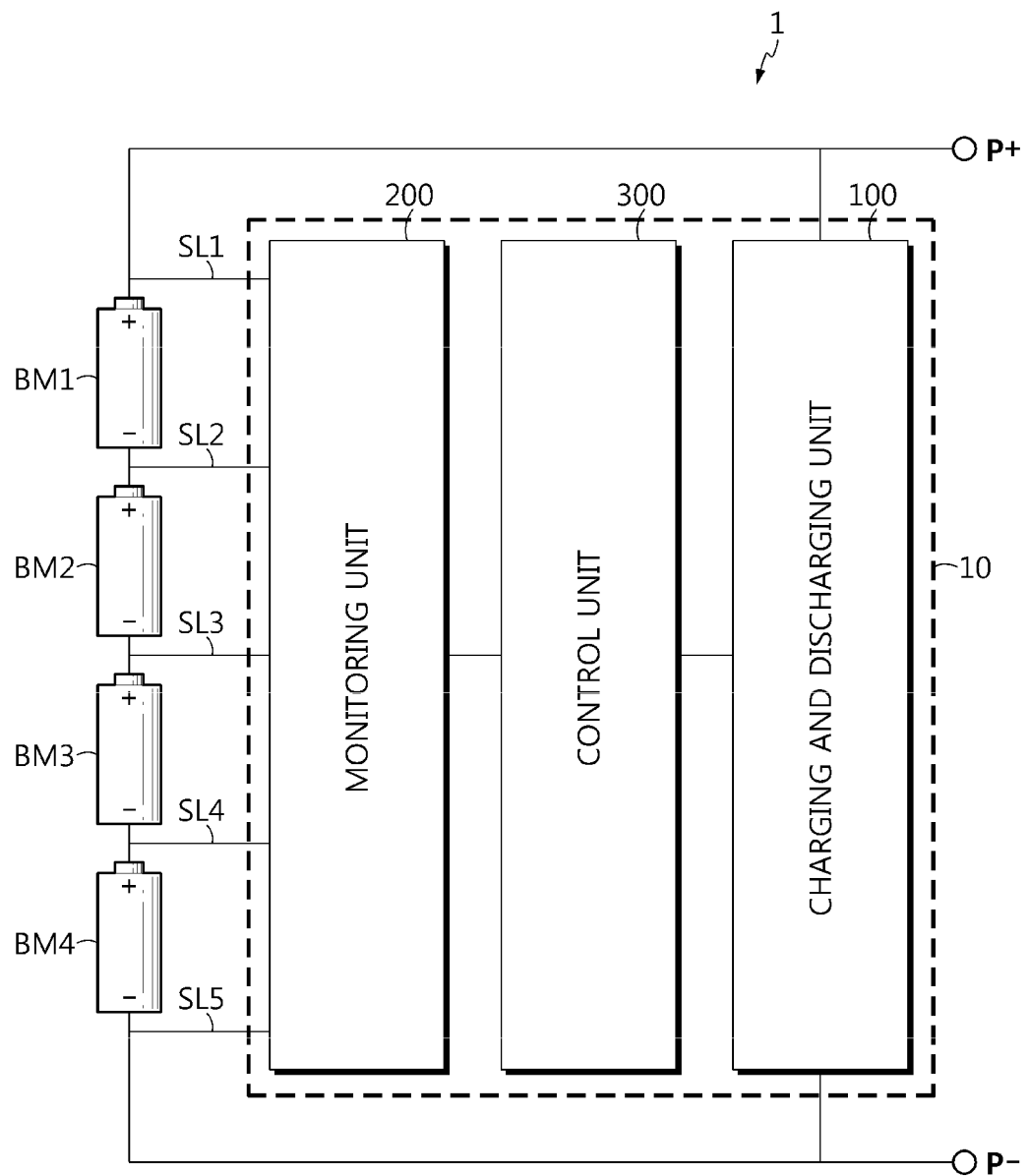
FIG. 1 is a diagram schematically showing an apparatus for diagnosing a state of a battery pack according to an embodiment of the present disclosure.

FIG. 1 is a diagram schematically showing an apparatus 10 for diagnosing a state of a battery pack according to an embodiment of the present disclosure.

Here, a battery pack 1 includes a plurality of battery modules and the apparatus 10 for diagnosing a state of a battery pack. Hereinafter, for convenience of description, with reference to the embodiment shown in FIG. 1, it will be described that four battery modules BM1, BM2, BM3 and BM4 are included in the battery pack 1.

In addition, the battery module may be a battery bank including one or a plurality of battery cells. If the battery module includes a plurality of battery cells, the plurality of battery cells may be connected in series and/or in parallel inside the battery module. Preferably, each battery module may include a plurality of battery cells connected in parallel with each other.

Referring to FIG. 1, the apparatus 10 for diagnosing a state of a battery pack according to an embodiment of the present disclosure may include a charging and discharging unit 100, a monitoring unit 200, and a control unit 300.

The charging and discharging unit 100 may be configured to discharge and charge the plurality of battery modules BM1, BM2, BM3 and BM4 in a plurality of cycles. Specifically, the charging and discharging cycle by the charging and discharging unit 100 may be performed at least once, particularly a plurality of times. Here, the charging and discharging cycle may refer to one process in which the battery module is discharged to a predetermined lower limit of SOC and then charged to a predetermined upper limit of SOC. That is, one cycle may mean a process in which the battery module is discharged to the lower limit of SOC and then charged again to the upper limit of SOC.

Alternatively, the charging and discharging cycle may refer to one process in which the battery module is charged to a predetermined upper limit of SOC and then discharged to a predetermined lower limit of SOC. That is, one cycle may mean a process in which the battery module is charged to the upper limit of SOC and then discharged to the lower limit of SOC.

Meanwhile, each of the battery modules BM1, BM2, BM3 and BM4 may include a plurality of battery cells connected to each other. In addition, the plurality of battery modules BM1, BM2, BM3 and BM4 may be electrically connected to each other. For example, the plurality of battery modules BM1, BM2, BM3 and BM4 may be connected in series to each other as shown in the figure. The charging and discharging unit 100 may be configured to charge and discharge the plurality of battery modules BM1, BM2, BM3 and BM4 electrically connected as described above as a whole.

For example, one end of the charging and discharging unit 100 may be connected to a positive electrode terminal (P+) of the battery pack 1, and the other end thereof may be connected to a negative electrode terminal (P−) of the battery pack 1. Thus, the charging and discharging unit 100 may charge or discharge the plurality of battery modules BM1, BM2, BM3 and BM4 by a control command of the control unit 300.

The monitoring unit 200 may be configured to measure voltage and/or current of the plurality of battery modules BM1, BM2, BM3 and BM4, which are completely charged, in every cycle.

For example, the monitoring unit 200 may be configured to measure the voltage of each battery module through a plurality of sensing lines SL1, SL2, SL3, SL4 and SL5.

As another example, the monitoring unit 200 may be configured to measure a current applied to each of the plurality of battery modules BM1, BM2, BM3 and BM4 or a current output from each of the plurality of battery modules BM1, BM2, BM3 and BM4. In this case, although not shown in the figure, the monitoring unit 200 may measure the voltage at both ends of a shunt resistor connected in series with the plurality of battery modules BM1, BM2, BM3 and BM4. In addition, the monitoring unit 200 may measure a current applied to the plurality of battery modules BM1, BM2, BM3 and BM4 or a current output from the plurality of battery modules BM1, BM2, BM3 and BM4 based on the measured potential difference between both ends of the shunt resistor.

For example, as in the embodiment shown in FIG. 1, the monitoring unit 200 is connected to the plurality of sensing lines SL1, SL2, SL3, SL4 and SL5, and the plurality of sensing lines SL1, SL2, SL3, SL4 and SL5 may be connected to the positive electrode terminals or the negative electrode terminals of the plurality of corresponding battery modules BM1, BM2, BM3 and BM4.

Specifically, the monitoring unit 200 may measure the voltage of the first battery module BM1 through the first sensing line SL1 and the second sensing line SL2. In addition, the monitoring unit 200 may measure the voltage of the second battery module BM2 through the second sensing line SL2 and the third sensing line SL3. In addition, the monitoring unit 200 may measure the voltage of the third battery module BM3 through the third sensing line SL3 and the fourth sensing line SL4. Also, the monitoring unit 200 may measure the voltage of the fourth battery module BM4 through the fourth sensing line SL4 and the fifth sensing line SL5.

Meanwhile, the monitoring unit 200 may also measure not only the voltage of each of the plurality of battery modules BM1, BM2, BM3 and BM4 but also the voltage of the plurality of battery modules BM1, BM2, BM3 and BM4 connected to each other, through the plurality of sensing lines SL1, SL2, SL3, SL4 and SL5.

For example, the monitoring unit 200 may measure the voltage of the first battery module BM1 and the second battery module BM2 through the first sensing line SL1 and the third sensing line SL3. That is, through two sensing lines selected from the plurality of sensing lines SL1, SL2, SL3, SL4 and SL5, the monitoring unit 200 may measure not only the voltage of each battery module BM1, BM2, BM3, BM4 but also the voltage of two or more battery modules.

The control unit 300 may be configured to change the number of battery cells connected to each other and included in the plurality of battery modules in every cycle.

For example, the control unit 300 may select one battery module in every cycle and change the number of battery cells included in the selected battery module and connected to each other. Alternatively, the control unit 300 may select a plurality of battery modules in every cycle and change the number of battery cells included in the plurality of selected battery modules.

The control unit 300 may receive measurement values for the voltage and/or current of the plurality of battery modules BM1, BM2, BM3 and BM4 measured by the monitoring unit 200.

Preferably, the charging and discharging unit 100, the monitoring unit 200 and the control unit 300 may be connected in a wireless and/or wired manner. That is, the control unit 300 may operate the charging and discharging unit 100 and the monitoring unit 200 by controlling the charging and discharging unit 100 and the monitoring unit 200, and may receive the measurement value from the monitoring unit 200.

In addition, the control unit 300 may estimate a state of charge (SOC) of each of the plurality of battery modules BM1, BM2, BM3 and BM4 based on the received measurement value.

For example, the control unit 300 may receive a voltage value for the voltage of each of the plurality of battery modules BM1, BM2, BM3 and BM4 measured by the monitoring unit 200 and estimate a SOC of each of the plurality of battery modules BM1, BM2, BM3 and BM4 based on the received voltage value. In this case, the control unit 300 may estimate the SOC of the battery module using a look-up table in which the voltage value and the SOC are mapped. Here, the look-up table may be stored in a memory of the control unit 300 or in a separate storage unit (not shown). In addition, the control unit 300 may estimate the SOC of each of the plurality of battery modules BM1, BM2, BM3 and BM4 using the look-up table.

As another example, the control unit 300 may estimate the SOC of each of the plurality of battery modules BM1, BM2, BM3 and BM4 by accumulating the current amount measured by the monitoring unit 200 during charging or discharging of the plurality of battery modules BM1, BM2, BM3 and BM4.

In general, since it is impossible to measure an open circuit voltage (OCV) in the process of charging or discharging a battery module and the estimation of SOC based on voltage or OCV is affected by temperature, the control unit 300 may be configured to estimate the SOC based on a current while the battery module is being charged or discharged.

Preferably, the control unit 300 may estimate the SOC of each of and the plurality of battery modules BM1, BM2, BM3 and BM4 by accumulating the current amount measured by the monitoring unit 200 during charging or discharging of the plurality of battery modules BM1, BM2, BM3 and BM4.

In addition, the control unit 300 may calculate an SOC change amount by comparing the SOC estimated for each of the battery modules with a preset reference value.

Here, the preset reference value may be set as an SOC estimated when the battery module in an initial state is fully charged. For example, the preset reference value may be an SOC estimated when all battery cells included in the battery module in an initial state are in a normal state and all battery cells are in a fully charged state. Therefore, the preset reference value may set to 100% and used as a reference value that becomes a comparison criterion for the SOC of the battery module estimated later.

The control unit 300 may calculate the SOC change amount by calculating a difference between the preset reference value and the SOC estimated for each of the battery modules. For example, in the embodiment shown in FIG. 1, assuming that the SOC of the first battery module BM1 is estimated to be 100%, the control unit 300 may calculate the difference between the SOC (100%) of the first battery module BM1 and the preset reference value (100%). In this case, the control unit 300 may calculate 0% as the SOC change amount for the first battery module BM1.

In addition, the control unit 300 may be configured to diagnose a state of the battery module based on the calculated SOC change amount and the changed number of battery cells.

For example, in the embodiment shown in FIG. 1, the control unit 300 may calculate the SOC change amount of each of the first battery module BM1, the second battery module BM2, the third battery module BM3 and the fourth battery module BM4, and diagnose the state of each of the first battery module BM1, second battery module BM2, third battery module BM3, and fourth battery module BM4 by comparing the calculated SOC change amount with a reference range.

Here, the reference range may be an aggregate of a plurality of regions. In addition, in each of the plurality of regions, an index or a reference for the expected number of battery cells may be set. That is, based on the result of comparing the calculated SOC change amount and the reference range, the control unit 300 may obtain a prediction result about the expected number of battery cells that are expected to be included in each of the plurality of battery modules BM1, BM2, BM3, and BM4 and connected to each other.

In addition, the control unit 300 may diagnose the state of each of the plurality of battery modules by comparing the prediction result of the expected number of battery cells with the changed number of battery cells. The process in which the control unit 300 diagnoses the state of the battery module based on the calculated SOC change amount and the changed number of battery cells will be described later in detail.

That is, the apparatus 10 for diagnosing a state of a battery pack according to an embodiment of the present disclosure has an advantage of diagnosing the state of the battery pack 1 including the plurality of battery modules BM1, BM2, BM3 and BM4 by diagnosing the state of each of the plurality of battery modules BM1, BM2, BM3 and BM4 based on the SOC change amount for each battery module.

In addition, the apparatus 10 for diagnosing a state of a battery pack according to an embodiment of the present disclosure has an advantage that the state of the battery module and the battery pack 1 may be diagnosed more quickly since the state of the battery module and the battery pack 1 is diagnosed based on the SOC change amount even if the battery module is not in an idle state or a no-load state.

The control unit 300 may be configured to select a target module among the plurality of battery modules BM1, BM2, BM3 and BM4 in every charging and discharging cycle. Here, the control unit 300 may select the target module before each charging and discharging cycle starts or after each charging and discharging cycle ends. Preferably, the control unit 300 may select the target module at a time point before the charging and discharging cycle starts.

For example, the control unit 300 may select the target module based on identification numbers assigned to the plurality of battery modules BM1, BM2, BM3 and BM4. That is, the control unit 300 may select a battery module whose identification information is set to 1 as a target module in the first cycle, and select a battery module whose identification information is set to 2 as a target module in the second cycle.

As another example, the control unit 300 may randomly select a target module among the plurality of battery modules BM1, BM2, BM3 and BM4. In this case, in order to prevent duplicate selection of battery modules, the control unit 300 may set a flag for the battery module selected in a former cycle. For example, the control unit 300 may set a flag for an already selected battery module to 1 and a flag for a battery module not yet selected to 0. The control unit 300 may randomly select a target module from battery modules whose flag is set to 0.

Hereinafter, for convenience of explanation, it will be described that the control unit 300 selects a battery module having identification information corresponding to the number of cycles. That is, the control unit 300 may select the first battery module BM1 as a target module in the first cycle and select the second battery module BM2 as a target module in the second cycle.

In addition, the control unit 300 may be configured to select a target cell among the plurality of battery cells included in the selected target module.

The target cell selection method may be similar to the method in which the control unit 300 selects a target module. That is, the control unit 300 may select a target cell based on an identification number assigned to a battery cell or may select a target cell based on a flag set to the battery cell.

In addition, the time point when the control unit 300 selects the target cell may be immediately after the target module is selected. That is, the control unit 300 may select a target module and select a target cell at a point immediately before the charging and discharging cycle starts.

For example, if the first battery module BM1 is selected as a target module in the first cycle, the control unit 300 may select a target cell among the plurality of battery cells included in the first battery module BM1.

In addition, the control unit 300 may be configured to block a connection between the target cell and the remaining cells inside the selected target module. This will be described in detail with reference to FIGS. 2 to 5.

FIGS. 2 to 5 are diagrams schematically showing operation processes of the apparatus 10 for diagnosing a state of a battery pack according to an embodiment of the present disclosure.

Figure 2:
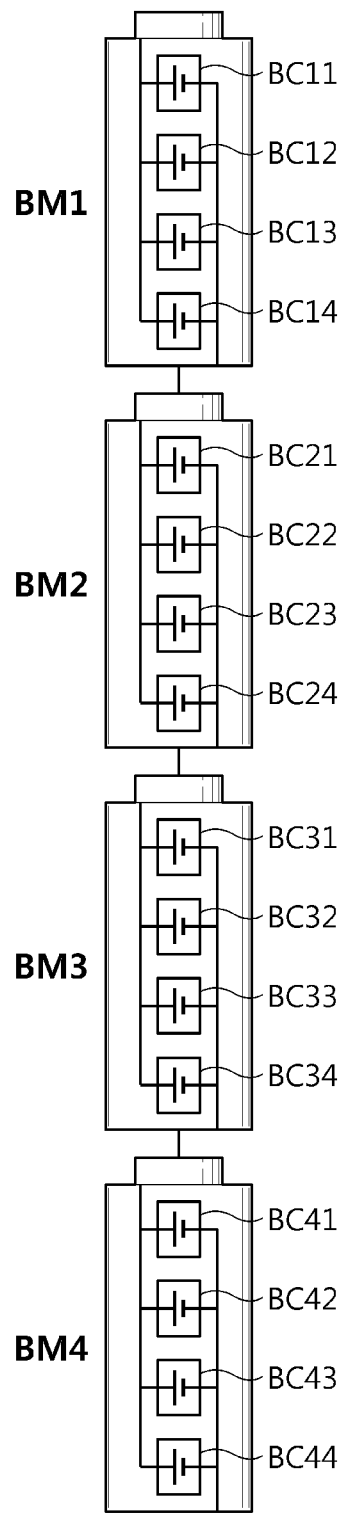
FIGS. 2 to 5 are diagrams schematically showing operation processes of the apparatus for diagnosing a state of a battery pack according to an embodiment of the present disclosure.
Figure 3:
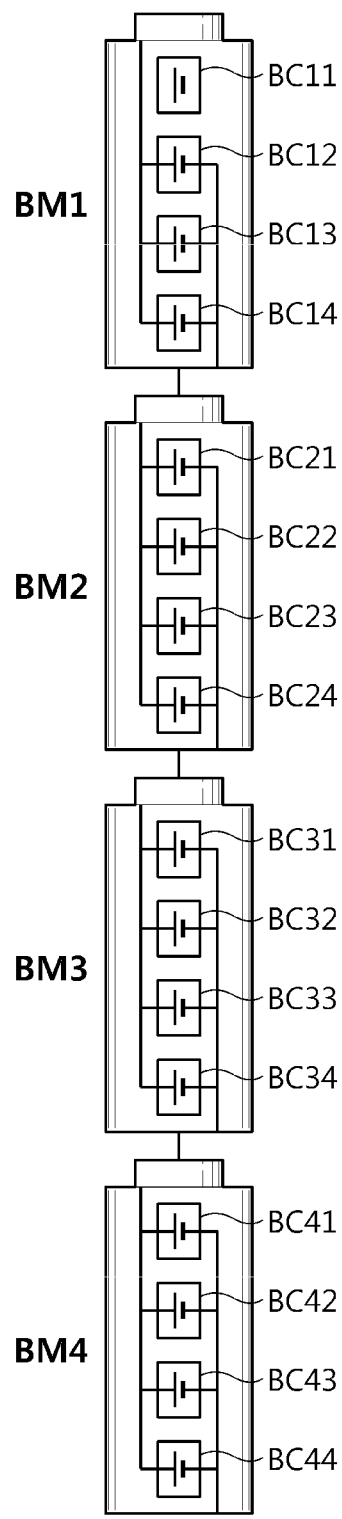
Figure 4:
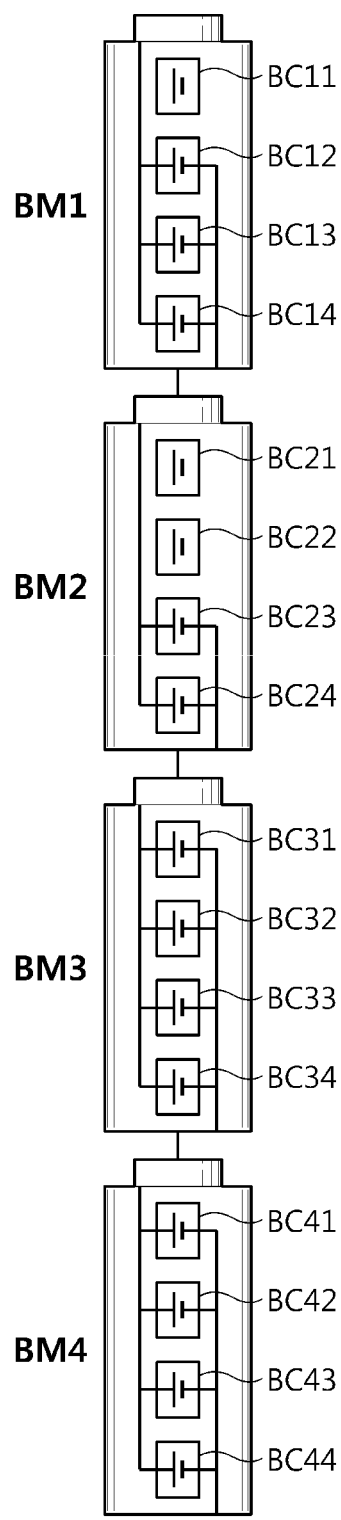
Figure 5:
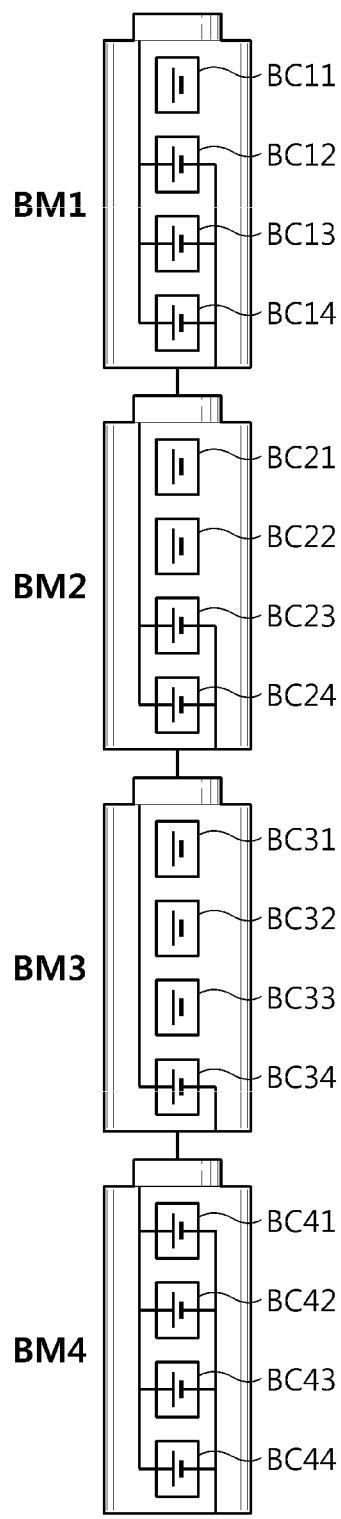

Specifically, FIG. 2 is a diagram schematically showing the plurality of battery modules BM1, BM2, BM3 and BM4 at an initial time point, and FIG. 3 is a diagram schematically showing the plurality of battery modules BM1, BM2, BM3 and BM4 in a first cycle. FIG. 4 is a diagram schematically showing the plurality of battery modules BM1, BM2, BM3 and BM4 in a second cycle, and FIG. 5 is a diagram schematically showing the plurality of battery modules BM1, BM2, BM3 and BM4 in a third cycle.

Hereinafter, for convenience of explanation, it will be described that the battery pack 1 includes four battery modules and each battery module includes four battery cells as shown in FIG. 2.

First, referring to FIG. 2, the battery pack 1 includes a first battery module BM1, a second battery module BM2, a third battery module BM3 and a fourth battery module BM4, and each battery module may include four battery cells.

The plurality of battery cells included in each of the plurality of battery modules BM1, BM2, BM3 and BM4 A may be connected in parallel to each other inside the battery module. In addition, the plurality of battery modules BM1, BM2, BM3 and BM4 may be connected to each other in series.

Referring to FIG. 3, the control unit 300 may select the first battery module BM1 as a target module in the first cycle. As described above, the control unit 300 may select the first battery module BM1 based on the identification number of the battery module, or may randomly select the first battery module BM1 based on the flag set in the battery module.

In addition, the control unit 300 may select a first battery cell BC11 as a target cell among the battery cells included in the first battery module BM1 selected as the target module in the first cycle. Also, the control unit 300 may block a connection of the first battery cell BC11 selected as the target cell to the second battery cell BC12, the third battery cell BC13 and the fourth battery cell BC14. The electrical connection of the target cell may be blocked using various cell connection control configurations known at the time of filing of this application, such as on-off control of a switch (not shown). In this case, only three battery cells may be connected in parallel inside the first battery module BM1, and four battery cells may be connected in parallel inside the second to fourth battery modules BM4.

In the first cycle, the control unit 300 may control the charging and discharging unit 100 to discharge and charge the battery cells included in the first to fourth battery modules BM4 and connected to each other. Preferably, the charging and discharging unit 100 may discharge and then charge again each of the plurality of battery modules BM1, BM2, BM3 and BM4.

In the first cycle, in the process of charging each of the plurality of battery modules BM1, BM2, BM3 and BM4, the monitoring unit 200 may measure the current applied to each of the plurality of battery modules BM1, BM2, BM3 and BM4, and the control unit 300 may estimate a SOC of each of the plurality of battery modules BM1, BM2, BM3 and BM4 based on the measurement value measured by the monitoring unit 200.

For example, it is assumed that the plurality of battery cells included in the plurality of battery modules BM1, BM2, BM3 and BM4 are all in a normal state and are an initial state where degradation does not occur. In this case, in the first cycle, the four battery cells included in the second battery module BM2, the third battery module BM3 and the fourth battery module BM4 are all connected in parallel, so the SOC of the second battery module BM2, the third battery module BM3 and the fourth battery module BM4 may be estimated to be 100%. Meanwhile, in the first cycle, since only three battery cells are connected in parallel inside the first battery module BM1, the SOC of the first battery module BM1 can may be reduced as much as the capacity of the first battery cell BC11. For example, in the first cycle, the SOC of the first battery module BM1 may be estimated to be 75%. Here, 75% may be a value compared to a preset reference value (for example, a SOC of the first battery module BM1 at an initial time point).

The control unit 300 may compare the estimated SOC of the first battery module BM1 with a preset reference value.

For example, as in the former embodiment, the SOC of the first battery module BM1 in the first cycle may be estimated to be 75%, and the preset reference value may be set to be 100%. Here, the preset reference value may be set as an SOC value measured after the battery module is fully charged in an initial state. In addition, the control unit 300 may calculate a difference between the preset reference value and the SOC of the first battery module BM1 to obtain a SOC change amount for the first battery module BM1 as 25%. In addition, the control unit 300 may diagnose the state of the first battery module BM1 based on the calculated SOC change amount (25%) for the first battery module BM1.

Referring to FIG. 4, the control unit 300 may select the second battery module BM2 as the target module in the second cycle.

After the SOC of each of the plurality of battery modules BM1, BM2, BM3 and BM4 is estimated in the first cycle, the charging and discharging unit 100 may discharge all of the plurality of battery modules BM1, BM2, BM3 and BM4. In addition, the control unit 300 may select the second battery module BM2 as the target module in the second cycle. The control unit 300 may select a first battery cell BC21 and a second battery cell BC22 as target cells among the battery cells included in the selected second battery module BM2. The control unit 300 may block the connection of the first battery cell BC21 and the second battery cell BC22 selected as the target cells in the second cycle to the third battery cell BC23 and the fourth battery cell BC24. In this case, in the second cycle, only three battery cells may be connected in parallel inside the first battery module BM1, only two battery cells may be connected in parallel inside the second battery module BM2, and four battery cells may be connected in parallel inside the third battery module BM3 and the fourth battery module BM4. After that, the charging and discharging unit 100 may charge all of the plurality of battery modules BM1, BM2, BM3 and BM4, and the control unit 300 may estimate the SOC of each of the plurality of battery modules BM1, BM2, BM3 and BM4.

For example, as in the former embodiment, since the connection of the first battery cell BC11 of the first battery module BM1 is blocked in the first cycle, the SOC of the first battery module BM1 may be estimated to be 75%, identical to the first cycle. In addition, since the connection of the first battery cell BC21 and the second battery cell BC22 of the second battery module BM2 is blocked in the second cycle, the SOC of the second battery module BM2 may be estimated to be 50%. Also, the SOC of the third battery module BM3 and the fourth battery module BM4 may be estimated to be 100%.

The control unit 300 may compare the estimated SOC of the second battery module BM2 with a preset reference value. For example, as in the former embodiment, the SOC of the second battery module BM2 in the second cycle may be estimated to be 50%, and the preset reference value may be set to be 100%. The control unit 300 may calculate a difference between the preset reference value and the SOC of the second battery module BM2 to obtain the SOC change amount for the second battery module BM2 as 50%. In addition, the control unit 300 may diagnose the state of the second battery module BM2 based on the calculated SOC change amount (50%) for the second battery module BM2.

Referring to FIG. 5, the control unit 300 may select the third battery module BM3 as a target module in the third cycle.

After the SOC of each of the plurality of battery modules BM1, BM2, BM3 and BM4 is estimated in the second cycle, the charging and discharging unit 100 may discharge all of the plurality of battery modules BM1, BM2, BM3 and BM4. In addition, the control unit 300 may select the third battery module BM3 as the target module in the third cycle. The control unit 300 may select a first battery cell BC31, a second battery cell BC32 and a third battery cell BC33 as target cells among the battery cells included in the selected third battery module BM3. The control unit 300 may block the connection of the first battery cell BC31, the second battery cell BC32 and the third battery cell BC33 selected as target cells in the third cycle to the fourth battery cell BC34. In this case, in the third cycle, only three battery cells may be connected in parallel inside the first battery module BM1, only two battery cells may be connected in parallel inside the second battery module BM2, and only one battery cell may be connected inside the third battery module BM3, and four battery cells may be connected in parallel inside the fourth battery module BM4. After that, the charging and discharging unit 100 may charge all of the plurality of battery modules BM1, BM2, BM3 and BM4, and the control unit 300 may estimate the SOC of each of the plurality of battery modules BM1, BM2, BM3 and BM4.

For example, as in the former embodiment, since the connection of the first battery cell BC11 of the first battery module BM1 is blocked in the first cycle, the SOC of the first battery module BM1 may be estimated to be 75%, identical to the first cycle. In addition, since the connection of the first battery cell BC21 and the second battery cell BC22 of the second battery module BM2 is blocked in the second cycle, the SOC of the second battery module BM2 may be estimated to be 50%. Also, since the connection of the first battery cell BC31, the second battery cell BC32 and the third battery cell BC33 of the third battery module BM3 is blocked in the third cycle, the SOC of the third battery module BM3 may be estimated to be 25%. In addition, the SOC of the fourth battery module BM4 may be estimated to be 100%.

The control unit 300 may compare the estimated SOC of the third battery module BM3 with a preset reference value. For example, as in the former embodiment, in the third cycle, the SOC of the third battery module BM3 may be estimated to be 25%, and the preset reference value may be set to be 100%. The control unit 300 may calculate a difference between the preset reference value and the SOC of the third battery module BM3 to obtain the SOC change amount for the third battery module BM3 as 75%. In addition, the control unit 300 may diagnose the state of the third battery module BM3 based on the calculated SOC change amount (75%) for the third battery module BM3.

As described above, the apparatus 10 for diagnosing a state of a battery pack according to an embodiment of the present disclosure may induce an abnormal situation in the battery module by forcibly blocking the connection of the plurality of battery cells included in the battery module. In addition, since the apparatus 10 for diagnosing a state of a battery pack diagnoses the state of the battery module and the battery pack 1 based on the induced abnormal situation, the battery module and the battery pack 1 may diagnose whether the state is a faulty state. Accordingly, there is an advantage in that the performance degradation of the battery module may be prevented in advance and problems such as overcharge or overdischarge of the battery cells may be prevented in advance.

Meanwhile, referring to the embodiments shown in FIGS. 2 and 5, the control unit 300 may block the connection of some of the battery cells included in the plurality of battery modules BM1, BM2, BM3 and BM4, while omitting the embodiments shown in FIGS. 3 and 4.

That is, the embodiment shown in FIG. 5 may be the state of the battery module in the first cycle. In this case, in the first cycle, the first battery cell BC11 may be blocked in the first battery module BM1, the first battery cell BC21 and the second battery cell BC22 may be blocked in the second battery module BM2, and the first battery cell BC31, the second battery cell BC32 and the third battery cell BC33 may be blocked in the third battery module BM3.

The control unit 300 may diagnose the state of each of the first battery module BM1, the second battery module BM2, the third battery module BM3 and the fourth battery module BM4 based on the SOC of each of the first battery module BM1, the second battery module BM2, the third battery module BM3 and the fourth battery module BM4.

As described above, the apparatus 10 for diagnosing a state of a battery pack according to an embodiment of the present disclosure may accurately diagnose the state of the battery pack 1 while changing the target module in every cycle. In addition, the apparatus 10 for diagnosing a state of a battery pack may quickly diagnose the state of the battery pack 1 by selecting a plurality of target modules at once and blocking the connection of some battery cells included in the target modules.

Here, the control unit 300 may optionally include a processor, an application-specific integrated circuit (ASIC), another chipset, a logic circuit, a register, a communication modem, and a data processing device, and the like, known in the art to execute various control logics disclosed below. In addition, when the control logic is implemented in software, the control unit 103 may be implemented as a set of program modules. At this time, the program module may be stored in a memory and executed by the processor. The memory may be provided in or out of the processor, and may be connected to the processor by various well-known means. In addition, the memory refers to a device in which information is stored regardless of the type of device, and does not refer to a specific memory device.

The control unit 300 may be a battery management system (BMS) that may be electrically coupled with a secondary battery, or a control element included in the battery management system. The battery management system may refer to a system called BMS in the technical field to which this application belongs, but any system that performs at least one function described in this specification in a functional point of view may be included in the category of the battery management system.

The control unit 300 may be configured to select a target module selected in every cycle so as not to overlap with a target module selected in a former cycle.

That is, the control unit 300 may not repeatedly select the same target module repeatedly in different cycles in order to quickly diagnose the state of the battery module.

For example, referring to FIGS. 3 to 5, the first battery module BM1 selected as the target module in the first cycle may not be selected as a target module in the second cycle and the third cycle. To this end, as described above, the control unit 300 may select a target module in every cycle by using the identification number of the battery module or the flag set in the battery module.

The apparatus 10 for diagnosing a state of a battery pack according to an embodiment of the present disclosure may induce various abnormal situations for all battery modules by preventing duplicate selection of a target module. Therefore, based on the abnormal situations induced for each of the plurality of battery modules, the state of battery pack 1 may be quickly diagnosed in various aspects.

The control unit 300 may be configured to change the number of target cells selected in the target module in every cycle. For example, the control unit 300 may be configured to increase or decrease the number of target cells selected in the target module in every cycle. Hereinafter, for convenience of explanation, a case where the number of target cells selected by the control unit 300 is increased one by one each time the cycle increases will be described.

Referring to FIGS. 3 to 5, the control unit 300 may select one target cell in the first cycle, two target cells in the second cycle, and three target cells in the third cycle. The maximum number of selected target cells may be smaller than the number of battery cells included in each of the plurality of battery modules BM1, BM2, BM3 and BM4. Preferably, the maximum number of selected target cells may be smaller than the number of battery cells included in each of the plurality of battery modules BM1, BM2, BM3 and BM4 by one.

For example, as in the embodiment shown in FIG. 5, in the third cycle, the connection of the first battery cell BC11 may be blocked in the first battery module BM1, the connection of the first battery cell BC21 and the second battery cell BC22 may be blocked in the second battery module BM2, and the connection of the first battery cell BC31, the second battery cell BC32 and the third battery cell BC33 may be blocked in the third battery module BM3.

In general, when a plurality of battery cells having different internal capacities are connected in series, the total internal capacity of the battery modules connected in series may be adapted to the battery cell having the smallest internal capacity. It is assumed that the internal capacity of a battery cell A is 3500 [mAh], the internal capacity of a battery cell B is 3600 [mAh], and the internal capacity of a battery cell C is 3600 [mAh]. At this time, if the battery cell A, the battery cell B and the battery cell C are connected in series, the internal capacity of the battery module connected in series may be 3500 [mAh]. That is, if a plurality of battery cells having different internal capacities are connected in series and used, the capacity of each battery cell may not be used at maximum. Thus, in order to prevent this capacitive damage, battery cells manufactured at the same time through the same production line may be used as the battery cells generally included in the battery module and the battery pack 1.

Therefore, since the number of battery cells whose connection is blocked for each battery module is changed, the apparatus 10 for diagnosing a state of a battery pack according to an embodiment of the present disclosure may quickly obtain the state diagnosis result of the battery module for various induced abnormal situations.

The charging and discharging unit 100 may be configured to discharge and charge battery cells connected to each other among the plurality of battery cells included in the battery module.

For example, referring to the embodiments shown in FIGS. 2 to 5, the connection of some battery cells among the plurality of battery cells included in each battery module may be blocked as the cycle progresses. Specifically, referring to the embodiment shown in FIG. 3, in the first cycle, the connection of the first battery cell BC11 may be blocked among the first battery cell BC11, the second battery cell BC12, the third battery cell BC13 and the fourth battery cell BC14 included in the first battery module BM1. Accordingly, the charging and discharging unit 100 may be configured to discharge and charge only the battery cells BC12, BC13 and BC14 connected to each other among the plurality of battery cells BC11, BC12, BC13 and BC14 included in the first battery module BM1.

The apparatus 10 for diagnosing a state of a battery pack according to an embodiment of the present disclosure has an advantage of shortening the charging and discharging time by charging and discharging battery cells connected to each other.

The control unit 300 may diagnose the state of the battery module to a normal state or a warning state according to a range to which the calculated SOC change amount belongs, among a plurality of reference ranges set based on the number of total battery cells included in the battery module.

Here, the plurality of reference ranges may be a plurality of ranges set according to the number of battery cells included in the battery module. For example, if four battery cells are included in the battery module, the plurality of reference ranges may include four reference ranges. For example, referring to the embodiment shown in FIG. 2, the plurality of reference ranges may include a $0^{th}$ reference range, a first reference range, a second reference range, a third reference range, and a fourth reference range.

The control unit 300 may predict the number of battery cells connected to each other within the battery module according to the range to which the calculated SOC change amount of the battery module belongs, among the plurality of reference ranges. That is, an index or a reference may be set for each of the plurality of reference ranges, and a predicted number of disconnected battery cells may be set in the index or reference.

For example, if the calculated SOC change amount of the battery module belongs to the $0^{th}$ reference range, the control unit 300 may predict the number of disconnected battery cells inside the battery module as 0. If the calculated SOC change amount of the battery module belongs to the first reference range, the control unit 300 may predict the number of disconnected battery cells inside the battery module as one. If the calculated SOC change amount of the battery module belongs to the second reference range, the control unit 300 may predict the number of disconnected battery cells inside the battery module as two. If the calculated SOC change amount of the battery module belongs to the third reference range, the control unit 300 may predict the number of disconnected battery cells inside the battery module as three. If the calculated SOC change amount of the battery module belongs to the fourth reference range, the control unit 300 may predict the number of disconnected battery cells inside the battery module as four.

If the number of battery cells included in the battery module is N, the number of cases in which the connection of the battery cells is blocked may be N+1 in total. For example, a case in which all battery cells are connected and a case in which 1 to N number of battery cells are disconnected may be included, and the total number of such cases is N+1.

Accordingly, as in the embodiment shown in FIG. 2, if four battery cells are included in the battery module, the plurality of reference ranges may include a $0^{th}$ reference range, a first reference range, a second reference range, a third reference range, and a fourth reference range.

In addition, if the number of disconnected battery cells inside the battery module by the control unit 300 is the same as the prediction result, the control unit 300 may diagnose the state of the battery module as a normal state. Conversely, if the number of disconnected battery cells inside the battery module by the control unit 300 is different from the prediction result, the control unit 300 may diagnose the state of the battery module as a warning state.

For example, in the embodiment shown in FIGS. 3 to 5, the $0^{th}$ reference range may be set to 0% or more and less than 5%, and the first reference range may be set to 20% or more and less than 30%. In addition, the second reference range may be set to 45% or more and less than 55%, and the third reference range may be set to 70% or more and less than 80%. Finally, the fourth reference range may be set to 95% or more and 100% or less.

If the SOC change amount of the first battery module BM1 is calculated as 25%, the control unit 300 may compare the SOC change amount (25%) of the first battery module BM1 with the plurality of reference ranges and determine that the SOC change amount (25%) of the first battery module BM1 belongs to the first reference range. In addition, the control unit 300 may predict the number of disconnected battery cells inside the first battery module BM1 as one by referring to the index or reference set in the first reference range. Since the first battery cell BC11 is the only battery cell that is disconnected inside the first battery module BM1 by the control unit 300 and the prediction result is also one, the control unit 300 may diagnose the state of the first battery module BM1 as a normal state.

The following description is on the assumption that the SOC change amount of the first battery module BM1 is calculated as 45%. If the SOC change amount is calculated higher than a theoretical change amount, this may be the case where there are other battery cells disconnected due to an external factor in addition to the battery cells disconnected by the control unit 300. The control unit 300 may compare the SOC change amount (45%) of the first battery module BM1 with the plurality of reference ranges and determine that the SOC change amount (45%) of the first battery module BM1 belongs to the second reference range. In addition, the control unit 300 may predict the number of disconnected battery cells inside the first battery module BM1 as two by referring to the index or reference set in the second reference range. Since only the first battery cell BC11 is disconnected inside the first battery module BM1 by the control unit 300 but the prediction result is two, the control unit 300 may diagnose the state of the first battery module BM1 as a warning state.

In addition, as in the former embodiment, depending on the number of battery cells included in the battery module, a region not belonging to any reference range may exist among the plurality of reference ranges. For example, when the first reference range is 20% or more and less than 30% and the second reference range is 45% or more and less than 55%, a region of 30% or more and less than 45% may not belong to any reference range. The control unit 300 may diagnose the state of the battery module as a warning state even when the SOC change amount of the battery module does not belong to any reference range.

In addition, the control unit 300 may be configured to output a diagnosis result.

For example, the apparatus 10 for diagnosing a state of a battery pack according to an embodiment of the present disclosure may further include a display unit to output a diagnosis result to the user. As another example, the apparatus 10 for diagnosing a state of a battery pack according to an embodiment of the present disclosure may further include a communication unit connected to an external network or a communication network to transmit a diagnosis result to the outside. In this case, the user may check the diagnosis result for the battery cell by receiving the diagnosis result through a user terminal such as a mobile phone.

That is, the apparatus 10 for diagnosing a state of a battery pack according to an embodiment of the present disclosure has an advantage of diagnosing the state of the battery module early by comparing the number of battery cells disconnected by the control unit 300 with the prediction result of the number of battery cells actually disconnected. In addition, the apparatus 10 for diagnosing a state of a battery pack has an advantage of inducing various abnormal situations by changing the number of disconnected battery cells in each battery module and diagnosing the state of the battery module according to the induced abnormal situation.

Meanwhile, the apparatus 10 for diagnosing a state of a battery pack according to an embodiment of the present disclosure may further include a storage unit for storing the diagnosis result. The storage unit may store the diagnosis result and provide comprehensive diagnosis details for the battery pack 1 to the user. Also, the control unit 300 may calculate the number of warning state diagnosis in which the state of the battery module stored in the storage unit is diagnosed as a warning state, before outputting the diagnosis result for the battery module through the display unit or the communication unit. In addition, the control unit 300 may be configured to output the latest diagnosis result for the battery module when the calculated number of warning state diagnosis is greater than or equal to a predetermined threshold. Here, the predetermined threshold may be basically set by the apparatus 10 for diagnosing a state of a battery pack, or may be changed by the user.

For example, the control unit 300 may be configured to output the diagnosis result for the first battery module BM1 stored in the storage unit if the number of warning state diagnosis for the first battery module BM1 is three or more.

The control unit 300 may block the connection between the battery pack 1 and the battery module whose state is diagnosed as a warning state.

Here, the battery module diagnosed as a warning state may be a battery module in which the number of battery cells disconnected by the control unit 300 is different from the prediction result. For example, if the state of the battery module is diagnosed as a warning state, the prediction result for predicting the number of battery cells disconnected based on the result of comparing the SOC change amount of the battery module with the plurality of reference ranges is two, but the number of battery cells disconnected by the control unit 300 may be one.

The control unit 300 may block the connection between the battery module diagnosed as a warning state and the battery pack 1, so as to immediately prevent a battery module other than the normal state maintains the connection with the battery pack 1.

In addition, the control unit 300 may connect the battery module that is disconnected from the battery pack 1 to a preliminary discharge line (not shown). Here, the preliminary discharge line is a line for discharging the battery module disconnected from the battery pack 1, and may include a discharge contactor and a discharge resistor. Preferably, after the connection between the battery module and the battery pack 1 is blocked, the control unit 300 may connect the battery module and the preliminary discharge line after a predetermined time passes before the battery module comes into an idle state or a no-load state.

In addition, the control unit 300 may re-estimate the SOC of the battery module disconnected from the battery pack 1 after a predetermined time passes.

Here, the predetermined time refers to a point in time when an open circuit voltage (OCV) of the battery module disconnected from the battery pack 1 is measured as an idle state or a no-load state.

Preferably, the monitoring unit 200 may measure the OCV when the battery module is in an idle state or a no-load state. That is, since the battery module disconnected from the battery pack 1 may be connected to the preliminary discharge line by the control unit 300, the monitoring unit 200 may measure the OCV of the battery module disconnected from the battery pack 1.

In addition, the control unit 300 may estimate the SOC of the battery module based on the OCV measured by the monitoring unit 200. Since OCV and SOC have a one-to-one correspondence, the control unit 300 may estimate the SOC of the battery module using a look-up table for OCV and SOC. In this case, the look-up table for OCV and SOC may be stored in a memory of the control unit 300 or in the storage unit.

The control unit 300 may re-calculate the SOC change amount by comparing the re-estimated SOC with the preset reference value again. In addition, like the former embodiment, the control unit 300 may re-diagnose the state of the battery module, which has been diagnosed as a warning state, based on the result of comparing the re-calculated SOC change amount with the plurality of reference ranges.

According to this configuration, the state of the battery module may be quickly diagnosed based on the SOC estimated in the process of charging or discharging the battery module, and the state of the battery module, which has been diagnosed as a warning state, may be re-diagnosed based on the OCV. Therefore, since the state of the battery module is accurately diagnosed through two steps, the accuracy of the state diagnosis of the battery module may be improved with high reliability.

The control unit 300 may be configured to output a diagnosis code based on the comparison result. Here, the diagnosis code may be obtained by coding the diagnosis result described above. Like the former embodiment, the control unit 300 may output the diagnosis code through a display unit or a communication unit.

The SOC estimated during charging or discharging of the battery module may be inaccurate compared to the SOC estimated based on the OCV. Therefore, the apparatus 10 for diagnosing a state of a battery pack according to an embodiment of the present disclosure will improve the reliability and accuracy of the diagnosis result by re-diagnosing the state based on OCV only for the battery module diagnosed as a warning state.

The battery pack 1 according to an embodiment of the present disclosure may include the apparatus 10 for diagnosing a state of a battery pack according to the present disclosure as described above. For example, as shown in FIG. 1, the battery pack 1 may include the plurality of battery modules BM1, BM2, BM3 and BM4 and the apparatus 10 for diagnosing a state of a battery pack. In addition, the battery pack 1 according to the present disclosure may further include electronic equipment (such as a BMS, a relay, a fuse, and the like) and a pack case, in addition to the apparatus 10 for diagnosing a state of a battery pack.

Hereinafter, a method for diagnosing a state of a battery pack 1 according to another embodiment of the present disclosure will be described with reference to the drawings.

Figure 6:
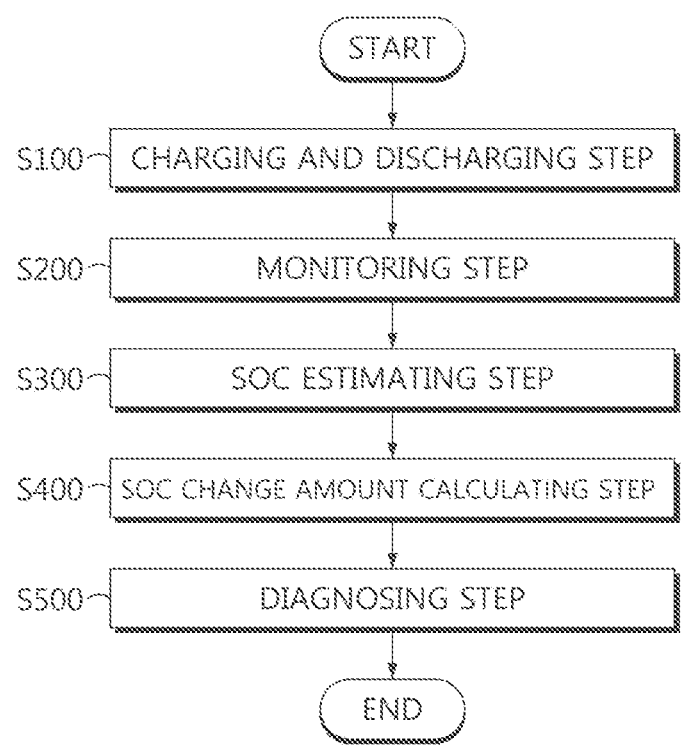
FIG. 6 is a diagram schematically showing a method for diagnosing a state of a battery pack according to another embodiment of the present disclosure.

FIG. 6 is a diagram schematically showing a method for diagnosing a state of a battery pack 1 according to another embodiment of the present disclosure. The method for diagnosing a state of a battery pack 1 according to another embodiment of the present disclosure may be performed by the apparatus 10 for diagnosing a state of a battery pack according to an embodiment of the present disclosure.

Referring to FIG. 6, the method for diagnosing the state of battery pack 1 according to another embodiment of the present disclosure may include a charging and discharging step (S100), a monitoring step (S200), a SOC estimating step (S300), a SOC change amount calculating step (S400) and a diagnosing step (S500).

The charging and discharging step (S100) is a step of discharging and charging the plurality of battery modules BM1, BM2, BM3 and BM4 having a plurality of battery cells connected to each other in every cycle, and may be performed by the charging and discharging unit 100.

The charging and discharging unit 100 may discharge and charge the plurality of battery modules BM1, BM2, BM3 and BM4 in every cycle. In this case, the charging and discharging unit 100 may discharge and charge only a battery cell connected to the battery module among the plurality of battery cells included in the battery module.

The monitoring step (S200) is a step of measuring a voltage or current of the battery module which is completely charged, and may be performed by the monitoring unit 200.

The SOC estimating step (S300) is a step of estimating the SOC of each of the battery modules based on the voltage or current measured in the monitoring step (S200), and may be performed by the control unit 300.

The control unit 300 may estimate the SOC of the battery module based on the look-up table for voltage and SOC and may also estimate the SOC of the battery module by integrating the amount of current flowing during charging or discharging of the battery module.

The SOC change amount calculating step (S400) is a step of calculating an SOC change amount obtained by comparing the estimated SOC of each of the battery modules with the preset reference value, and may be performed by the control unit 300.

The control unit 300 may compare the estimated SOC of each battery module with the preset reference value.

For example, the preset reference value may be set to 100%. In the embodiment shown in FIG. 3, assuming that the SOC of the first battery module BM1 is estimated to be 75%, the control unit 300 may calculate a difference between the preset reference value and the estimated SOC of the first battery module BM1 to calculate the SOC change amount of the first battery module BM1 as 25%.

The diagnosing step (S500) is a step of diagnosing the state of the battery module based on the calculation result of the SOC change amount, and may be performed by the control unit 300.

The control unit 300 may diagnose the state of the battery module as a normal state or a warning state according to a range to which the calculated SOC change amount belongs, among the plurality of reference ranges set based on the number of total battery cells included in the battery module.

For example, as in the former embodiment, referring to the embodiment shown in FIGS. 3 to 5, when four battery cells are included in the battery module, the plurality of reference ranges may include first to third reference ranges. In this case, the first reference range may be set to 20% or more and less than 30%, and the second reference range may be set to 45% or more and less than 55%. The third reference range may be set to 70% or more and less than 80%.

If the SOC change amount of the first battery module BM1 is calculated as 25%, the control unit 300 may compare the SOC change amount (25%) of the first battery module BM1 with the plurality of reference ranges and determine that the SOC change amount (25%) of the first battery module BM1 belongs to the first reference range. In addition, the control unit 300 may actually predict the number of disconnected battery cells inside the first battery module BM1 as one. Since the first battery cell BC11 is the only battery cell that is disconnected inside the first battery module BM1 by the control unit 300 and the prediction result is also one, the control unit 300 may diagnose the state of the first battery module BM1 as a normal state.

That is, the method for diagnosing a state of a battery pack 1 according to an embodiment of the present disclosure has an advantage of diagnosing the state of the battery pack 1 including the battery module by diagnosing the state of each battery module based on the SOC change amount of each battery module.

Figure 7:
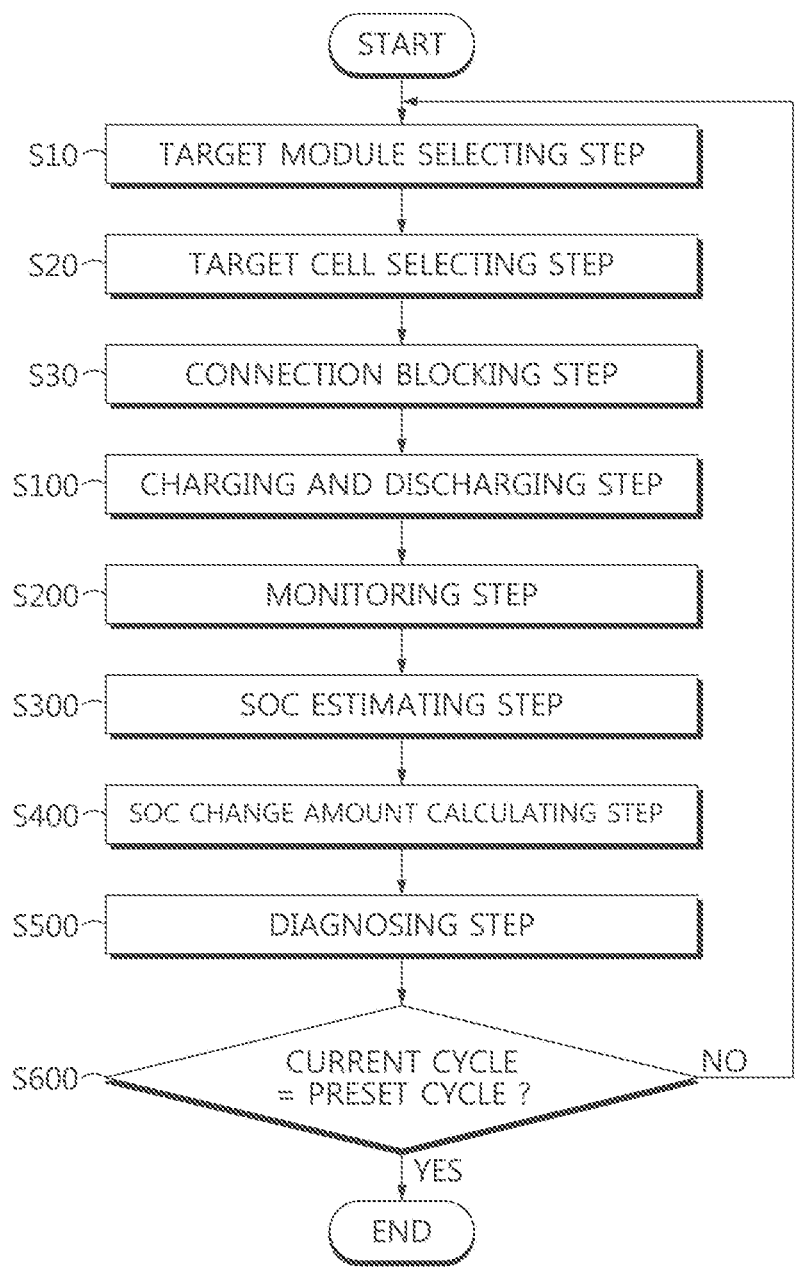
FIG. 7 is a diagram schematically showing a method for diagnosing a state of a battery pack according to still another embodiment of the present disclosure.

FIG. 7 is a diagram schematically showing a method for diagnosing a state of a battery pack 1 according to still another embodiment of the present disclosure.

Referring to FIG. 7, before the charging and discharging step (S100), a target module selecting step (S10), a target cell selecting step (S20), and a connection blocking step (S30) may be further included.

The target module selecting step (S10) is a step of selecting a target module among the plurality of battery modules BM1, BM2, BM3 and BM4, and may be performed by the control unit 300.

In every cycle, the control unit 300 may select a target module based on an identification number assigned to the plurality of battery modules BM1, BM2, BM3 and BM4, or select a target module randomly based on a flag set in the plurality of battery modules BM1, BM2, BM3 and BM4. That is, the control unit 300 may select a battery module as a target module in every cycle not to be overlapped.

For example, referring to FIGS. 3 to 5, the control unit 300 may select the first battery module BM1 as a target module in the first cycle, select the second battery module BM2 as a target module in the second cycle, and select the third battery module BM3 as a target module in the third cycle.

The target cell selecting step (S20) is a step of selecting a target cell among the plurality of battery cells included in the selected target module, and may be performed by the control unit 300.

The connection of the battery cell selected as a target cell may be blocked from the remaining battery cells included in the corresponding battery module. The control unit 300 may select a target cell in a similar way to the method of selecting a target module. For example, the control unit 300 may select a target cell based on an identification number assigned to the battery cell, or randomly select a target cell based on a flag set in the battery cell.

Also, the number of target cells to be selected may be changed in every cycle. Preferably, the number of target cells to be selected may be increased each time the cycle proceeds.

For example, referring to FIGS. 3 to 5, one target cell BC11 may be selected in the first cycle, two target cells BC21 and BC22 may be selected in the second cycle, and three target cells BC31, BC32 and BC33 may be selected in the third cycle.

The connection blocking step (S30) is a step of blocking the connection between the target cell and the remaining cells in the selected target module, and may be performed by the control unit 300.

In addition, after the diagnosing step (S500), a cycle comparing step (S600) may be performed.

The cycle comparing step (S600) is a step of comparing whether the current cycle is the same as the preset cycle, and may be performed by the control unit 300. Here, the preset cycle may be related to the number of state diagnosis repeatedly performed for the battery pack 1. Preferably, the preset cycle may be set smaller than the number of battery modules included in the battery pack 1. For example, assuming that four battery modules are connected in series in the battery pack 1, the preset cycle may be set to 3. In each cycle, since the target module is selected as a battery module not selected in the former cycle, the preset cycle may be set smaller than the number of battery modules included in the battery pack 1.

If the current cycle is the same as the preset cycle, the control unit 300 may be configured to terminate the method for diagnosing a state of the battery pack 1.

The method for diagnosing a state of the battery pack 1 according to another embodiment of the present disclosure may induce an abnormal situation to constitute the plurality of battery modules BM1, BM2, BM3 and BM4 so that the number of battery cells connected to each other is changed, through the target module selecting step (S10), the target cell selecting step (S20) and the connection blocking step (S30). Therefore, the method for diagnosing a state of the battery pack 1 has an advantage of diagnosing the state of the battery module and the battery pack 1 in various aspects by diagnosing the state of each battery module in an induced abnormal situation.

Figure 8:
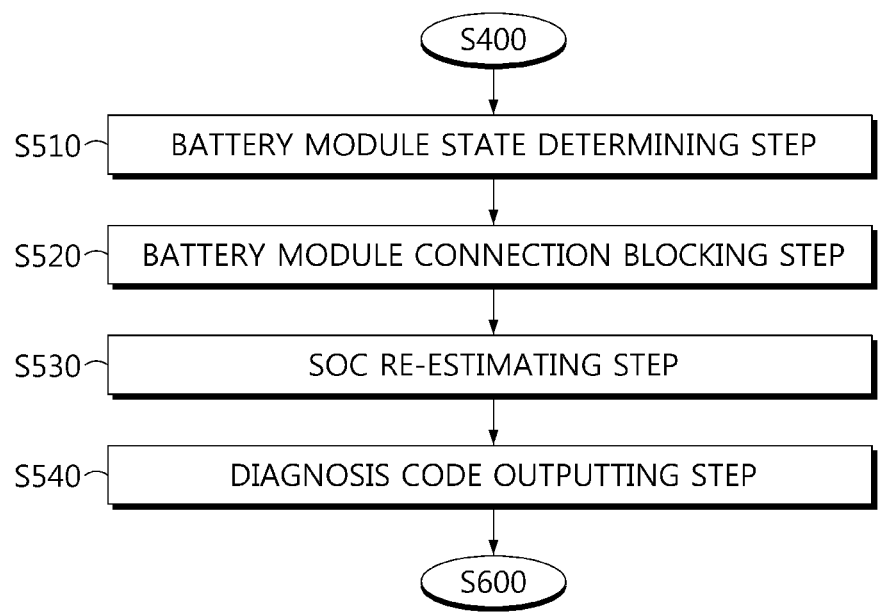
FIG. 8 is a diagram schematically showing a diagnosing step, in the method for diagnosing a state of a battery pack according to still another embodiment of the present disclosure.

FIG. 8 is a diagram schematically showing a diagnosing step (S500), in the method for diagnosing a state of a battery pack 1 according to still another embodiment of the present disclosure.

Referring to FIG. 8, the diagnosing step (S500) may include a battery module state determining step (S510), a battery module connection blocking step (S520), an SOC re-estimating step (S530), and a diagnosis code outputting step (S540). That is, in the embodiment shown in FIGS. 6 and 7, the battery module state determining step (S510), the battery module connection blocking step (S520), the SOC re-estimating step (S530) and the diagnosis code outputting step (S540) may be performed after the SOC change amount calculating step (S400).

The battery module state determining step (S510) is a step of determining the state of the battery module as any one of a normal state and a warning state based on the range to which the calculated SOC change amount belongs, among the plurality of reference ranges set based on the number of total battery cells included in the battery module is, and may be performed by the control unit 300.

For example, it is assumed that the plurality of reference ranges includes a first reference range, a second reference range and a third reference range. If the calculated SOC change amount of the battery module belongs to the first reference range, the control unit 300 may predict the number of disconnected battery cells inside the battery module as one. If the calculated SOC change amount of the battery module belongs to the second reference range, the control unit 300 may predict the number of disconnected battery cells inside the battery module as two. If the calculated SOC change amount of the battery module belongs to the third reference range, the control unit 300 may predict the number of disconnected battery cells inside the battery module as three.

In addition, if the number of battery cells disconnected by the control unit 300 is the same as the prediction result, the state of the corresponding battery module may be determined as a normal state. Conversely, if the number of battery cells disconnected by the control unit 300 is different from the prediction result, the state of the corresponding battery module may be determined as a warning state.

For example, as in the former embodiment, referring to the embodiments shown in FIGS. 3 to 5, if four battery cells are included in the battery module, the plurality of reference ranges may include first to third reference ranges. In this case, the first reference range may be set to 20% or more and less than 30%, and the second reference range may be set to 45% or more and less than 55%. The third reference range may be set to 70% or more and less than 80%.

If the SOC change amount of the first battery module BM1 is calculated as 25%, the control unit 300 may compare the SOC change amount (25%) of the first battery module BM1 with the plurality of reference ranges and determine that the SOC change amount (25%) of the first battery module BM1 belongs to the first reference range. In addition, the control unit 300 may actually predict the number of disconnected battery cells inside the first battery module BM1 as one. Since only the first battery cell BC11 is disconnected inside the first battery module BM1 by the control unit 300 and the prediction result is also one, the control unit 300 may determine the state of the first battery module BM1 as a normal state.

The following description is on the assumption that the SOC change amount of the first battery module BM1 is calculated as 45%. If the SOC change amount is calculated higher than a theoretical change amount, this may be the case where there are other battery cells disconnected due to an external factor in addition to the battery cells disconnected by the control unit 300. The control unit 300 may compare the SOC change amount (45%) of the first battery module BM1 with the plurality of reference ranges and determine that the SOC change amount (45%) of the first battery module BM1 belongs to the second reference range. In addition, the control unit 300 may predict the number of disconnected battery cells inside the first battery module BM1 as two. Since only the first battery cell BC11 is disconnected inside the first battery module BM1 by the control unit 300 but the prediction result is two, the control unit 300 may diagnose the state of the first battery module BM1 as a warning state.

The battery module connection blocking step (S520) is a step of blocking the connection between the battery module determined as a warning state and the battery pack 1 as a result of determination in the battery module state determining step (S510), and may be performed by the control unit 300.

The control unit 300 may block the connection between the battery module determined as a warning state and the battery pack 1. That is, the battery module in the warning state may be continuously connected to the battery pack 1 to prevent charging or discharging. Therefore, according to this configuration, since the charging and discharging of the battery module in the warning state is blocked, accidents such as swelling, ignition and explosion that may occur from the battery module in the warning state may be prevented.

In addition, the control unit 300 may connect the disconnected battery module to the preliminary discharge line (not shown).

The SOC re-estimating step (S530) is a step of re-estimating the SOC of the battery module disconnected from the battery pack 1 after a predetermined time passes from the battery module connection blocking step (S520), and may be performed by the monitoring unit 200 and the control unit 300.

Here, the point of time when the predetermined time passes is a point of time when the battery module disconnected from the battery pack 1 comes into an idle state or a no-load state, and refer to a point of time when OCV can be measured.

After the predetermined time passes, the monitoring unit 200 may measure the OCV of the battery module disconnected from the battery pack 1. That is, since the battery module disconnected from the battery pack 1 is connected to the preliminary discharge line, the OCV may be measured by the monitoring unit 200 even if the battery module is disconnected from the battery pack 1. Preferably, after the battery module and the battery pack 1 are disconnected, the control unit 300 may connect the battery module and the preliminary discharge line after a predetermined time passes before the battery module comes into an idle state or a no-load state. In addition, the monitoring unit 200 may measure the OCV immediately after the battery module and the preliminary discharge line are connected.

The control unit 300 may re-estimate the SOC of the battery module based on the OCV measured by the monitoring unit 200.

The diagnosis code outputting step (S540) is a step of comparing the re-estimated SOC with a predetermined reference value and outputting a diagnosis code based on the comparison result, and may be performed by the control unit 300.

Preferably, in the diagnosis code outputting step (S540), the SOC change amount calculating step (S400) may be performed again. That is, the control unit 300 may compare the re-estimated SOC with the predetermined reference value to calculate an SOC change amount, and may compare the calculated SOC change amount with the plurality of reference ranges. In addition, the control unit 300 may diagnose the state of the battery module as a normal state or a warning state based on the comparison result, and may output a diagnosis code.

The embodiments of the present disclosure described above are not necessarily implemented by an apparatus and method but may also be implemented through a program for realizing functions corresponding to the configuration of the present disclosure or a recording medium on which the program is recorded. Such implementation may be easily performed by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

1: battery pack
10: apparatus for diagnosing a state of a battery pack
100: charging and discharging unit
200: monitoring unit
300: control unit
BM1 to BM4: first to fourth battery module
BC11 to BC14: first to fourth battery cells included in the first battery module
BC21 to BC24: first to fourth battery cells included in the second battery module
BC31 to BC34: first to fourth battery cells included in the third battery module
BC41 to BC44: first to fourth battery cells included in the fourth battery module

What is claimed is:

1. An apparatus for diagnosing a state of a battery pack, comprising:
   a charging and discharging assembly configured to discharge and charge a plurality of battery modules having a plurality of battery cells connected to each other, in a plurality of cycles;
   a monitoring assembly configured to measure a voltage or current of the plurality of battery modules in a fully charged state, in every cycle; and
   a controller configured to, in every cycle:
   change a number of battery cells included in the plurality of battery modules and connected to each other,
   receive a measurement value for the voltage or current of the plurality of battery modules measured by the monitoring assembly,
   estimate a state of charge (SOC) of each of the plurality of battery modules based on the received measurement value,
   calculate a SOC change amount by comparing the estimated SOC of each of the plurality of battery modules with a preset reference value, and
   diagnose a state of the plurality of battery modules based on the calculated SOC change amount and the changed number of battery cells included in the plurality of battery modules.

2. The apparatus for diagnosing the state of the battery pack according to claim 1, wherein the controller is configured to change the number of battery cells included in the plurality of battery modules and connected to each other by:
   selecting a target battery module among the plurality of battery modules,
   selecting a target battery cell among the plurality of battery cells included in the selected target module, and
   blocking a connection between the target battery cell and the remaining cells in the selected target battery module.

3. The apparatus for diagnosing the state of the battery pack according to claim 2, wherein the controller is configured to select the target battery module in every cycle such that the selected target battery module does not overlap with a target battery module selected in a former cycle.

4. The apparatus for diagnosing the state of the battery pack according to claim 2, wherein the controller is configured to, in every cycle, change a number of target battery cells selected in the target battery module.

5. The apparatus for diagnosing the state of the battery pack according to claim 2, wherein the charging and discharging assembly is configured to discharge and charge battery cells connected to each other among the plurality of battery cells included in the plurality of battery modules.

6. The apparatus for diagnosing the state of the battery pack according to claim 1, wherein the controller is configured to diagnose the state of each battery module as a normal state or a warning state according to a range of the calculated SOC change amount for each battery module, among a plurality of reference ranges set based on a number of total battery cells included in each battery module, and output the diagnosis result.

7. The apparatus for diagnosing the state of the battery pack according to claim 6, wherein the controller is further configured to:
   block a connection between the battery pack and the battery module among the plurality of battery modules whose state is diagnosed as the warning state, re-estimate the SOC of the battery module disconnected from the battery pack after a predetermined time passes, compare the re-estimated SOC with the preset reference value, and output a diagnosis code based on the comparison result.

8. A battery pack, comprising the apparatus for diagnosing the state of the battery pack according to claim 1.

9. A method for diagnosing a state of a battery pack, the method comprising:

changing a number of battery cells included in a plurality of battery modules and connected to each other, in every cycle;

discharging and charging the plurality of battery modules having a plurality of battery cells connected to each other, in every cycle;

measuring a voltage or current of the plurality of battery modules in a fully charged state;

estimating a state of charge (SOC) of each battery module based on the measured voltage or current;

calculating a SOC change amount by comparing the estimated SOC of each battery module with a preset reference value; and diagnosing a state of the plurality of battery modules based on the calculated SOC change amount and the changed number of battery cells included in the plurality of battery modules.

10. The method for diagnosing the state of the battery pack according to claim 9, further comprising, before the charging and discharging:

selecting a target battery module among the plurality of battery modules;

selecting a target battery cell among the plurality of battery cells included in the selected target battery module; and blocking a connection between the target battery cell and the remaining cells in the selected target battery module.

11. The method for diagnosing the state of the battery pack according to claim 9, wherein the diagnosing includes:

determining the state of each battery module as any one of a normal state and a warning state, based on a range to which the calculated SOC change amount belongs, among a plurality of reference ranges set based on a number of total battery cells included each battery module;

blocking a connection between the battery module determined as the warning state and the battery pack, as a result of the determination;

re-estimating the SOC of the battery module disconnected from the battery pack, after a predetermined time passes from the blocking the connection between the battery module determined as the warning state and the battery pack; and comparing the re-estimated SOC with a predetermined reference value and outputting a diagnosis code based on the comparison result.

12. The method for diagnosing the state of the battery pack according to claim 10, further comprising changing a number of target battery cells selected in every cycle.

13. The method for diagnosing the state of the battery pack according to claim 12, comprising selecting the target battery module in every cycle so that the selected target battery module does not overlap with a target battery module selected in a former cycle.

* * * * *